United States Patent
Kakimoto et al.

(10) Patent No.: US 6,958,095 B2
(45) Date of Patent: Oct. 25, 2005

(54) APPARATUS FOR MANUFACTURING STACKED TYPE ELECTRONIC PART

(76) Inventors: Masakazu Kakimoto, 1-2702, Kamisawa, Midori-ku, Nagoya-shi, Aichi-ken (JP); Fumiaki Matsumoto, c/o UHT Corporation, of 446-268, Az Shimokagamida, Oaza Haruki, Togo-cho, Aichi-gun, Aichi-ken (JP); Hisashi Yasoda, c/o Kanazawa R & D Center of UHT Corporation, of 168, Shimeno-cho minami, Kanazawa-shi, Ishikawa-ken (JP); Makoto Furuta, c/o UHT Corporation, of 446-268, Aza Shimokagamida, Oaza Haruki, Togo-cho, Aichi-gun, Aichi-ken (JP)

(*) Notice: Subject to any disclaimer, the term of this patent is extended or adjusted under 35 U.S.C. 154(b) by 0 days.

(21) Appl. No.: 10/397,270

(22) Filed: Mar. 27, 2003

(65) Prior Publication Data

US 2003/0183165 A1 Oct. 2, 2003

(30) Foreign Application Priority Data

Mar. 29, 2002 (JP) .......................... 2002-95854

(51) Int. Cl.$^7$ .............................. B05B 7/06; B05C 5/00
(52) U.S. Cl. ....................................... 118/314; 118/315
(58) Field of Search ................................ 118/313, 314, 118/315, 316, 206

(56) References Cited

U.S. PATENT DOCUMENTS

| 5,059,266 A | * 10/1991 | Yamane et al. ............. 118/313 |
| 5,126,529 A | 6/1992 | Weiss et al. |
| 5,196,064 A | 3/1993 | Branderhorst et al. |
| 5,260,009 A | 11/1993 | Penn |
| 5,681,757 A | 10/1997 | Hayes |
| 5,833,914 A | 11/1998 | Kawaguchi |
| 6,159,772 A | 12/2000 | Vinciarelli et al. |
| 6,177,714 B1 | * 1/2001 | Nagai .......................... 257/529 |
| 6,503,831 B2 | * 1/2003 | Speakman ................... 438/674 |
| 2003/0159783 A1 | 8/2003 | Kakimoto et al. |

FOREIGN PATENT DOCUMENTS

| EP | 1074355 | 2/2001 |
| JP | 9-232174 | 9/1997 |
| JP | 10-15929 | 1/1998 |

OTHER PUBLICATIONS

JP 9-232,174 English translation Abstract and whole document.*
English Language Abstract of JP 10-15929.

* cited by examiner

*Primary Examiner*—Chris Fiorilla
*Assistant Examiner*—Yewebdar Tadesse
(74) *Attorney, Agent, or Firm*—Greenblum & Bernstein, P.L.C.

(57) ABSTRACT

An object of the present invention is to provide an apparatus for manufacturing a stacked type electronic part which can manufacture a stacked type electronic part dried at low temperature for a product by increasing a manufacturing speed. A base plate is placed in a predetermined linear section path to be moved back and forth and be moved vertically. Above the section path are juxtaposed one or more insulator layer forming means discharging an insulating resin paste, conductor layer forming means jetting a conductor paste by an ink jet system and drying means drying the pastes. A thin film layer having a predetermined conductor pattern placed on an insulator layer while the base plate is moved back and forth one or more times. Those steps are repeated to form a stacked type electronic part.

23 Claims, 17 Drawing Sheets

Fig. 6A
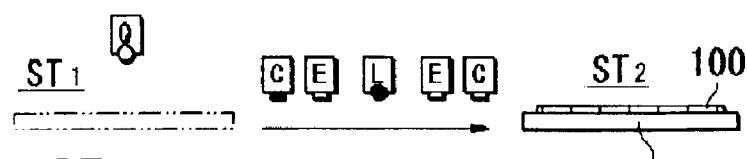
Fig. 6B
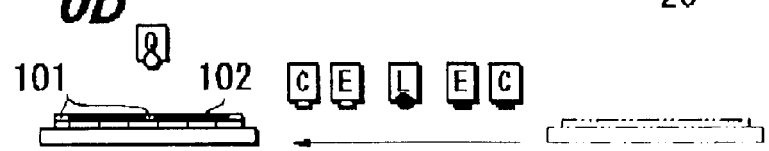
Fig. 6C
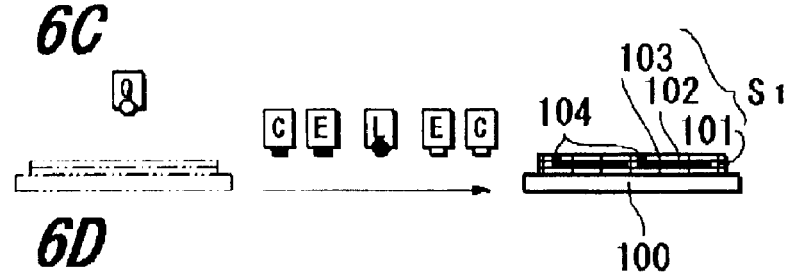
Fig. 6D
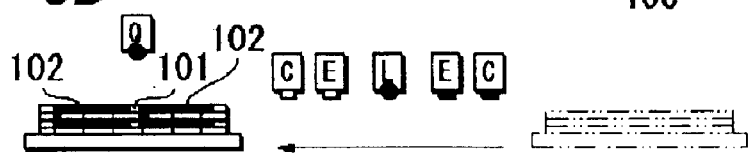
Fig. 6E
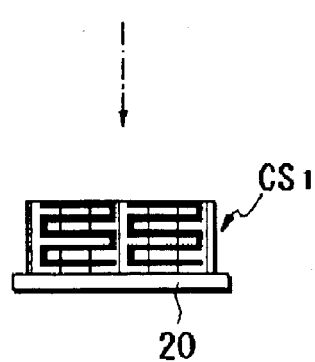

APPARATUS FOR MANUFACTURING STACKED TYPE ELECTRONIC PART

BACKGROUND OF THE INVENTION

1. Field of the Invention

The present invention relates to an apparatus for manufacturing a stacked type electronic part. More specifically, the present invention relates to an apparatus for manufacturing a stacked type electronic part such as a stacked substrate (wiring substrate and package substrate), a capacitor, an inductor, a resistor and a magnetic material.

2. Description of the Related Art

A prior art stacked type electronic part has a required number of thin film layers deposited by repeating a forming step with a ceramics insulator layer and a predetermined electrode pattern. A method for stacking the thin film layers by omitting use of a resin carrier film which has been practically used as a base plate is proposed in Japanese Patent Application Laid-Open No. Hei 9-232174.

In the publication, a base plate can be moved in X and Y directions by a mechanism using a servomotor and a ball screw. In place of that, a slurry jet head can be moved in X and Y directions. In place of the base plate, a metal endless belt is used. In this case, a slurry jet head and a paste jet head are controlled to be moved in the vertical direction to the travel direction of the endless belt.

Further, in the publication, a required number of slurry jet heads and a required number of paste jet heads may be arrayed in predetermined order along the travel direction of the endless belt. Stacks may be manufactured one after another with travel of the endless belt in one direction.

SUMMARY OF THE INVENTION

When ceramics slurry is used as an insulator layer to be stacked for a product, firing at high temperature using a large furnace is necessary.

The disclosed technique of the publication has many practical problems as a specific apparatus and is difficult to embody as-is. For example, as described in the embodiment of the disclosed technique, the slurry jet head as insulator layer forming means and the paste jet head as conductor layer forming means get in and out alternately at a predetermined position on the base plate movable in X and Y directions. It takes a long time for time and positioning control in movement of the jet heads. Practical productivity cannot be expected to manufacture a stack of 100 to several hundred layers.

In the embodiment in which the endless belt is used to manufacture stacks one after another with travel of the endless belt in one direction. The number of slurry jet heads and paste jet heads corresponding to manufacturing of a stack having several hundred layers must be arranged. The equipment cost is significantly high. The apparatus is larger since a large installation floor area is needed.

To increase productivity, each time an insulator layer and a conductor layer are formed, drying means drying the layers is needed. Temporary pressing means and holing means are required when necessary. In this case, in addition to the slurry jet head and the paste jet head, the drying means, temporary pressing means and holing means must be added. There are the disadvantages of lowered productivity, larger apparatus and higher equipment cost.

The present invention has been made in view of the prior art circumstances. An object of the present invention is to provide an apparatus for manufacturing a stacked type electronic part which can be dried at low temperature without being fired to be a product.

Another object of the present invention is to provide an apparatus for manufacturing a stacked type electronic part which is produced by increasing a manufacturing speed.

A further object of the present invention is to provide an apparatus for manufacturing a stacked type electronic part which is easily practically used and smaller by units of working means.

In a technical means for achieving the object, an apparatus for manufacturing a stacked type electronic part having a stage, insulator layer forming means discharging an insulating resin paste, and conductor layer forming means jetting a conductor paste, wherein the respective means stack on the stage a required number of thin film layers having a predetermined conductor pattern placed on an insulator layer.

The insulator layer is formed by the insulating resin paste and the predetermined conductor pattern is formed by the conductor paste. When a required number of thin film layers are stacked to be integrated with each other for a product, a stacked type electronic part which can be dried at low temperature is manufactured.

The insulating resin paste of a thermoplastic resin and the conductor paste to which a dry solvent is added are discharged and jetted. The insulating resin paste and the conductor paste hardened without being dried by the drying means are used as a discharged paste from the insulator layer forming means and a jetted paste from the conductor layer forming means.

As its specific structure, preferably, the stage is a base plate, the base plate being provided in a predetermined linear section path so as to be moved back and forth and be moved vertically, above the section path are juxtaposed one or more insulator layer forming means discharging an insulating resin paste and conductor layer forming means jetting a conductor paste by an ink jet system, and a required number of thin film layers having a predetermined conductor pattern placed on an insulator layer are stacked while the base plate is moved back and forth in the section path one or more times.

A plurality of insulator layer forming means and conductor layer forming means are juxtaposed. The base plate is moved back and forth in the linear section path in which they are arranged. A predetermined working is effectively performed in the steps of moving forth and moving back.

An apparatus for manufacturing a stacked type electronic part having a stage, insulator layer forming means discharging an insulating resin paste, conductor layer forming means jetting a conductor paste, and drying means drying the pastes, wherein the respective means stack on the stage a required number of thin film layers having a predetermined conductor pattern placed on an insulator layer.

The drying means drying the discharged insulating resin paste and jetted conductor paste is added.

As an example of its specific structure, as described previously, the stage is a base plate, the base plate being provided in a predetermined linear section path so as to be moved back and forth and be moved vertically, above the section path are juxtaposed one or more insulator layer forming means discharging an insulating resin paste, conductor layer forming means jetting a conductor paste by an ink jet system and drying means drying the pastes, and a required number of thin film layers having a predetermined conductor pattern placed on an insulator layer are stacked while the base plate is moved back and forth in the section path one or more times.

The arrangement of the insulator layer forming means, the conductor layer forming means and the drying means is suitably set according to the working steps such as the step of forming an insulator layer by an insulating resin paste and the step of forming a conductor layer by a conductor paste. The drying step by the drying means is frequent. At least one of one or more drying means is arranged in the substantially central part of the section, path, which is effective in the working efficiency.

As the drying means, any one of a heating or hot air system, a light irradiation system, a laser irradiation system and a heating plate pressing system serving as the later-described temporary pressing means is optionally used. The insulator layer and conductor layer are brought into a half-hardened state so as not to be tacky.

A doctor blade system, an ink jet system or a roller coating system, which is generally known, is employed as the insulator layer forming means. To increase accuracy corresponding to a denser insulator layer, the ink jet system is preferably used for at least one of them. In a part forming an insulator layer on the entire surface of one thin film layer, the doctor blade system and the roller coating system are employed. A combination of the ink jet system and other systems is optional.

Conductor layers are formed on the insulator layer to form one thin film layer. A recessed part occurs between the conductor layers to deteriorate flatness of the thin film layer. When the thin film layers are stacked, the recessed part causes a gap so that a void occurs in an electronic part manufactured by drying at low temperature.

To secure flatness of the thin film layer, the recessed part must be filled by the insulator layer. The insulator layer forming means fills the insulating resin paste into a recessed part between conductor layers formed by the conductor layer forming means or a predetermined region except for a region formed with the conductor layer. The ink jet system is suitably employed as the insulator layer forming means in this case.

When the stacked type electronic part is for an inductor, a via conductor (via electrode) connecting conductor layers of the upper and lower thin film layers must be formed.

The conductor layer forming means is the ink jet system. The means can form the via conductor (via electrode). The conductor layer forming means may jet the conductor paste onto the conductor pattern by the ink jet system to form a via conductor (via electrode).

In the via conductor (via electrode), as performed generally, a via hole may be holed in the insulator layer of the thin film layer to fill the conductor paste into the hole. In this case, a laser holing system is preferably used as holing means. Specifically, the laser holing means are added and juxtaposed in the section path. The conductor paste is filled by the conductor layer forming means by the ink jet system into the via hole holed by the holing means to form a via conductor (via electrode).

To flatten micro-irregularities caused in the insulating resin paste and conductor paste of the thin film layer for securing flatness and to make the stacked layers uniform for increasing stacked accuracy, each time one thin film layer is formed, the top surface of the layer at the appropriate time is preferably pressed. The temporary pressing means made of a heating plate or a roll are added and juxtaposed in the section path in which the base plate is moved.

As described above, when the heating plate is used as the temporary pressing means, the temporary pressing means can serve as the drying means.

The temporary pressing means may be operated each time one thin film layer is formed, each time a plurality of thin film layers are formed, each time the reciprocated base plate is moved forth, or the reciprocated base plate is moved back. As in claim 6, when the insulating resin paste is filled into the recessed part between the conductor layers, flatness is secured to some extent. The temporary pressing means is not always necessary.

A preferable specific structure of the temporary pressing means is a pressing roll contacted with an insulating resin paste and a conductor paste dried by the drying means and having on its surface very small adhesiveness, and a particle removing roller having adhesiveness is brought into contact with the roller.

The insulating resin paste and the conductor paste coated by the ink jet system are dried by the drying means so as not to be tacky. Micro-irregularities are flattened upon contact of the pressing roll. A particle coming off from the convex part is adhered onto the pressing roll to be removed. The particle adhered onto the roll is adhered onto the particle removing roll to be removed.

The insulator layer forming means, the conductor layer forming means, the drying means and the laser holing means are units, and the units can be exchanged with each other. This is suitable when the arrangement of the units is changed to set them to the apparatus for manufacturing a different stacked type electronic part such as a capacitor and an inductor.

Another specific structure of the present invention has a polygonal rotating drum in which flat stages are partitioned continuously in its outer circumference so as to be rotated intermittently, and a film supply mechanism winding a carrier film around the outer circumference of the rotating drum and lays it on the stages, wherein in the working part opposite the stages when the rotating drum is stopped are disposed one or more insulator layer forming means discharging an insulating resin paste, conductor layer forming means jetting a conductor paste by an ink jet system, and drying means drying the pastes (which is unnecessary in an embodiment), and for each rotation of the rotating drum, a required number of thin film layers having a predetermined conductor pattern placed on an insulator layer on the carrier film of the stage are stacked (drum type, not shown). Otherwise, insulator layer forming means discharging an insulating resin paste, conductor layer forming means jetting a conductor paste by an ink jet system, and drying means drying the pastes (which is unnecessary in an embodiment) are provided above the stage so as to get in and out, and the insulator layer forming means, the drying means and the conductor layer forming means get in and out above the stage so as to stack on the stage a required number of thin film layers having a predetermined conductor pattern placed on an insulator layer (means getting in-and-out method, not shown).

The stacked type electronic part refers to a stacked substrate (wiring substrate and package substrate), an inductor, a capacitor, a resistor and a magnetic material.

The resin material of the insulating resin sheet and the insulating resin paste includes an epoxy resin and a polyimide resin.

As the conductor paste of the stacked substrate, inductor and capacitor, copper conductor material, tungsten W, molybdenum Mo or manganese Mn is used. As the conductor paste for the via electrode as the via conductor, silver conductor material having a low conductor resistance, for example, silver, silver-palladium, silver-platinum, and silver-palladium-platinum are suitable. As the resistance part of the resistor, carbon-silver is used as its example.

As the magnetic material, ferrite is used as the conductor paste for magnetism. As the electrode pattern and via electrode placed there about, a conductor material of the same kind as the previously described one is used.

BRIEF DESCRIPTION OF THE DRAWINGS

FIGS. 6A–6E are front views of assistance in explaining the working steps of a first embodiment of the present invention;

DESCRIPTION OF THE PREFERRED EMBODIMENT(S)

Embodiments of the present invention will be described based on the drawings.

Figure 1:
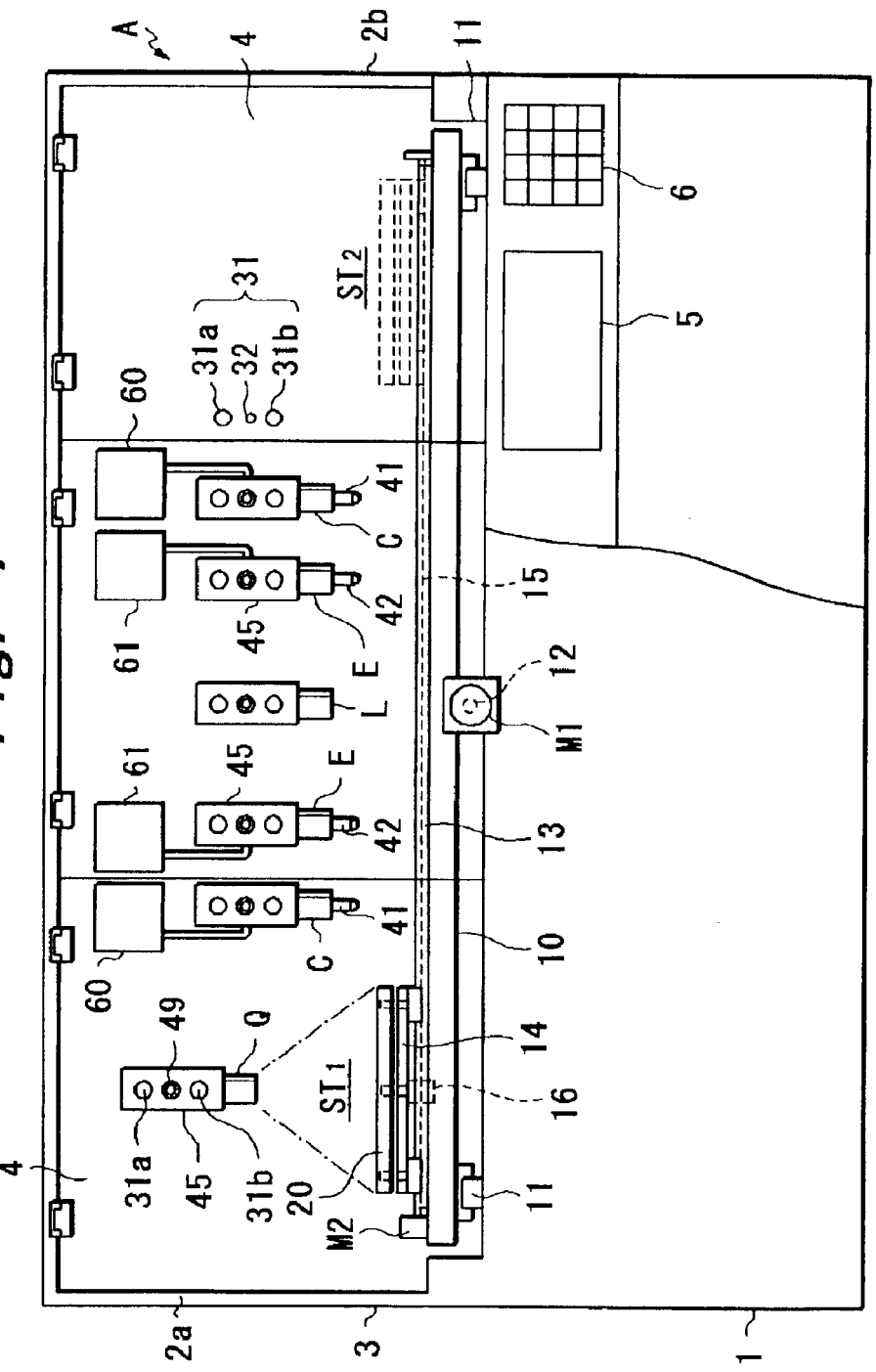
FIG. 1 is a front view showing an apparatus for manufacturing a stacked type electronic part of the present invention.
Figure 2:
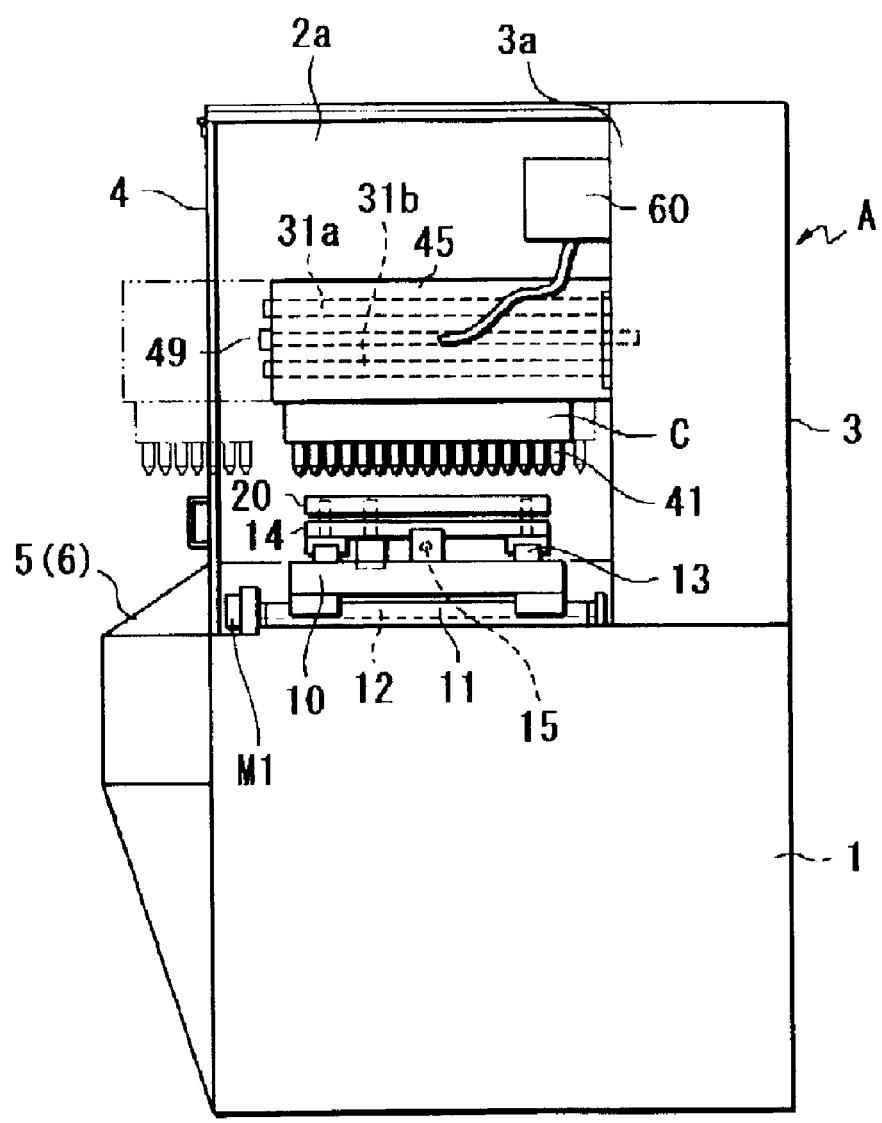
FIG. 2 is a side view, partially cut away, of FIG. 1.
Figure 3:
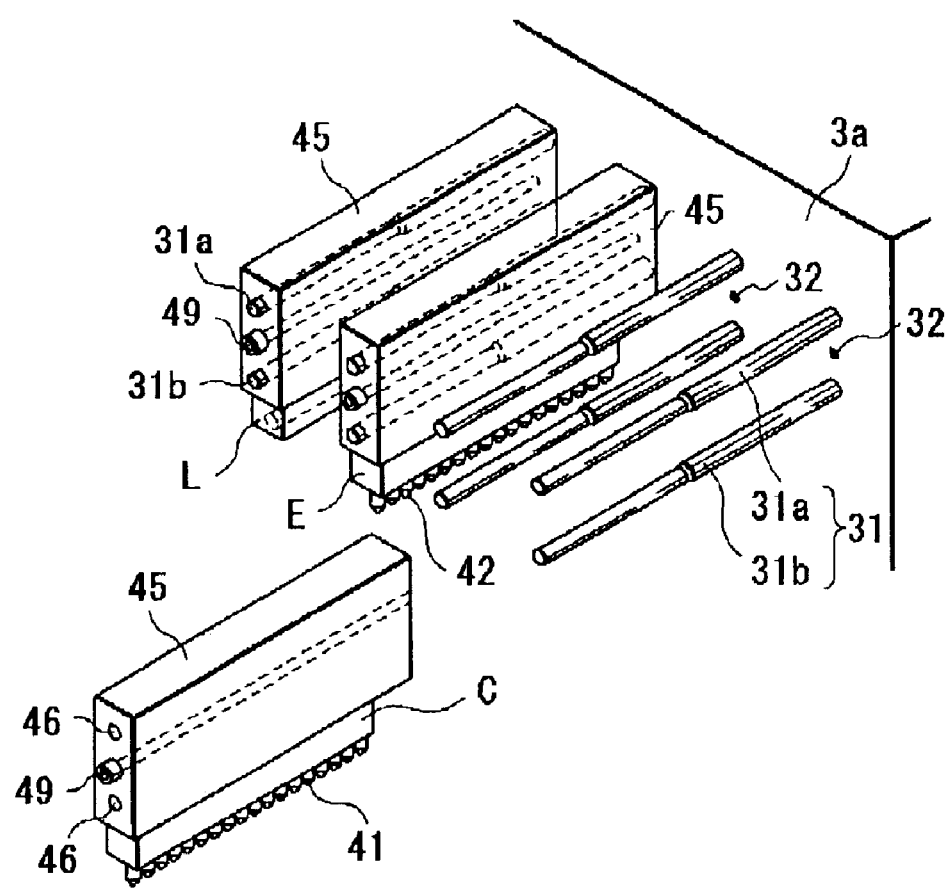
FIG. 3 is a perspective view of assistance in explaining the attaching structure of units.

FIGS. 1 to 3 show the overview of the entire apparatus. In the drawings, in frame A, on the top surface of a housing base part 1 having a lateral width of about 2 m, right and left side walls 2a, 2b and a housing back wall part 3 are integrally assembled and a rigid support wall 3a is disposed in the back wall part 3. At its front surface is attached a transparent hood 4 divided into two or three so as to be opened and closed.

In the frame A, as shown in the drawings, a display part 5 and a console part 6 are disposed in a suitable position such as one side of the front surface of the housing base part 1. A control box and wiring equipment, not shown, are arranged in the housing base part 1 and the housing back wall part 3.

A working table 10 is arranged on the top surface part of the housing base part 1 of the frame A.

The working table 10 is a table having an area slightly smaller than that of the top surface of the housing base part 1, and is arranged on right and left guide rails 11 extended in the front and back directions so as to be moved a short distance in the front and back directions (Y axis direction) thereby being moved back and forth in the Y axis direction by a driving source M1 of a servomotor or a stepping motor and a driving shaft (screw shaft) 12 rotated by it.

Two guide rails 13 spaced at the front and back sides on the top surface of the working table 10 are laid in parallel with the support wall 3a. A moving table 14 is provided on the guide rails 13 so as to be moved back and forth in the right and left directions (X axis direction) along the rails.

The moving table 14 is controlled so as to be moved back and forth in the X axis direction by a driving source M2 of a servomotor or a stepping motor and a driving shaft (screw shaft) 15 rotated by it. On the moving table 14 is disposed a stainless stage (hereinafter, called a base plate) 20 via an air cylinder 16.

The base plate 20 is moved back and forth in a predetermined section in the X axis direction in parallel with the support wall 3a by the driving source M2 and the driving shaft 15, is moved back and forth a short distance in the Y axis direction by the driving source M1 and the driving shaft 12, and is moved vertically by the air cylinder 16.

The base plate 20 is moved back and forth in the X direction in the section between a one end side stage $ST_1$ (the solid line position of FIG. 1) and the other end side stage $ST_2$ (the phantom line position of FIG. 1) of the working table 10.

The movement back and forth and the vertical movement of the base plate 20 are controlled by the controller of the control box, not shown. Data of the controller can be adjusted by the console part 6.

On the support wall 3a of the housing back wall part 3 is disposed a support member 31 having a set of two support rods 31a, 31b spaced at the upper and lower sides. A nut hole 32 is disposed between the set of support rods 31a, 31b.

A plurality of sets (seven sets shown in the drawing) of the support members 31 are arranged at a predetermined space along the X axis direction. The support rods 31a are horizontally protruded above the working table 10. Using the support member 31, one or more of insulator layer forming means, conductor layer forming means, drying means, laser holing means, temporary pressing means and camera units are attached to be detachable and exchanged. Specifically, one or more of the insulator layer forming means, conductor layer forming means and drying means are attached essentially. The laser holing means, the temporary pressing means and camera units are attached to be selectively exchanged when necessary.

As the insulator layer forming means is used an insulating resin paste jet unit C of an ink jet system jetting an insulating resin paste. As the conductor layer forming unit is used a conductor paste jet unit E of an ink jet system jetting a conductor paste. As the drying means is used a light irradiation unit L drying the insulating resin paste and conductor paste by light irradiation in a half-hardened state so as not to be tacky.

In the insulating resin paste jet unit C, many ink jet nozzles 41 are juxtaposed at very small spaces and the insulating resin paste is jetted from the selected nozzle. Also in the conductor paste jet unit E, many ink jet nozzles 42 are juxtaposed at very small spaces and the paste is jetted from the selected nozzle.

As the laser holing means, a laser unit P having many laser heads juxtaposed at very small spaces is used. As the temporary pressing means, a roll pressing unit R having a pressing roll movable vertically is used. As the camera unit, a CCD camera unit Q having a CCD camera is used.

In the laser unit P, the laser units are connected to a laser generator to hole the insulator layer by irradiating a laser light from the selected laser unit.

The roll pressing unit R, as described later based on FIG. 18, temporarily presses at the appropriate time the top surface of a thin film layer having the formed insulator layer and conductor layer.

The CCD camera unit Q images a surface image of the thin film layer at the appropriate time to transmit it to an image processor.

In the units, that is, the insulating resin paste jet unit C, the conductor paste jet unit E, the light irradiation unit L, the laser unit P, the roll pressing unit R and the CCD camera unit Q, attaching parts 45 to the support member 31 formed in the respective upper half parts are of the same structure.

Figure 4:
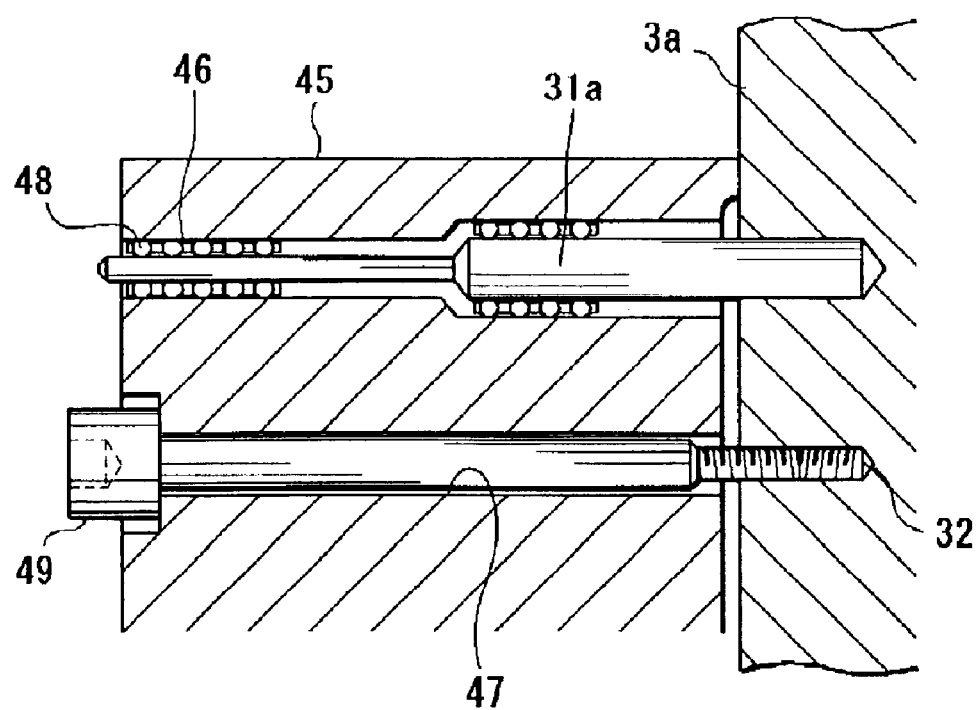
FIG. 4 is a partially cross-sectional enlarged view showing the attaching structure of the units.

The attaching parts 45 are rectangular having substantially the same length as that of the support rod 31a of the support member 31. Two attaching holes 46, 46 extended in its longitudinal direction are holed to be spaced at the upper and lower sides. A shaft hole 47 is holed in the middle of both the attaching holes to be extended in the longitudinal direction. In the attaching hole 46 is fitted a cylindrical retainer 48 housing balls having a very small diameter to be protruded in and out and rotated (see FIG. 4).

When the units C, E, L, P, R and Q are used, the attaching hole 46 is extended therethrough so that the support rod 31a of the support member 31 is slid in the retainer 48 of each of the attaching parts 45. After that, a fastening bolt 49 is inserted into the shaft hole 47 so that its edge is attached in a spiral at the nut hole 32 of the support wall 3a. The attaching part 45 is fastened onto the support wall 3a to set each of the units at a predetermined position.

The fastening bolt 49 is pulled out to remove the attaching part 45 from the support rod 31a. The units can be detached and exchanged.

Figure 5:
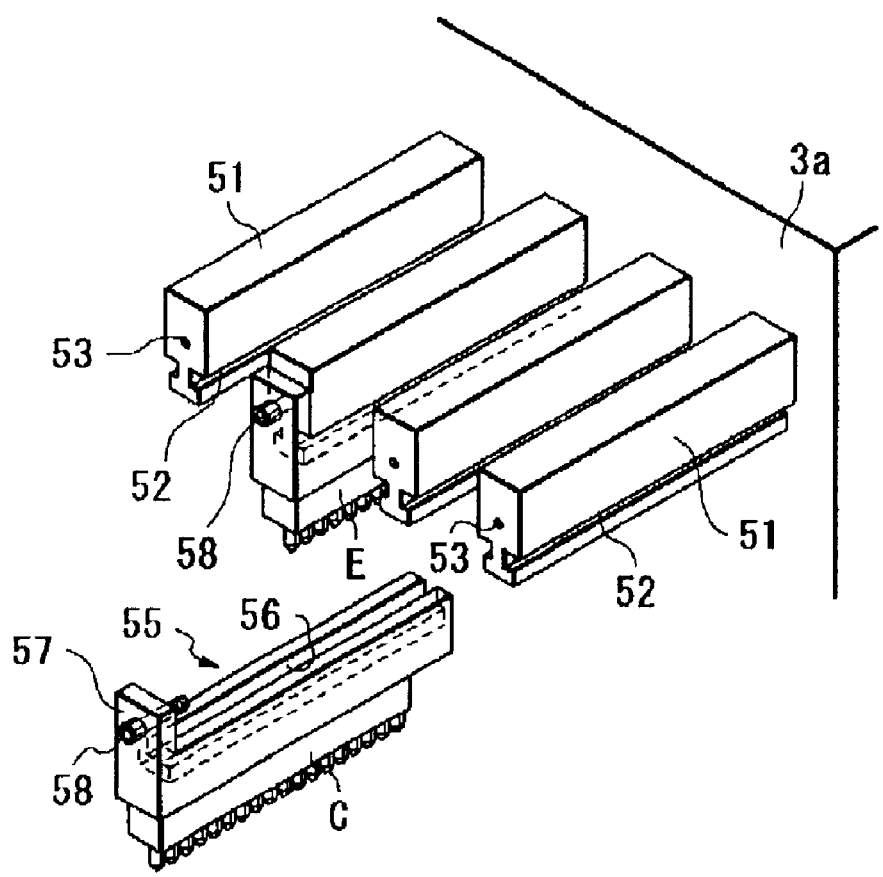
FIG. 5 is a perspective view of assistance in explaining another embodiment of the attaching structure of units.
Figure 7A:
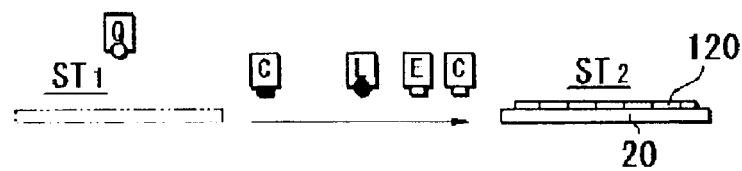
FIGS. 7A–7D are front views of assistance in explaining the working steps of a second embodiment of the present invention.
Figure 7B:
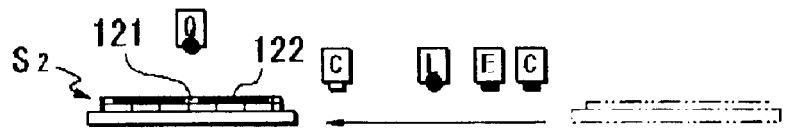
Figure 7C:
Figure 7D:
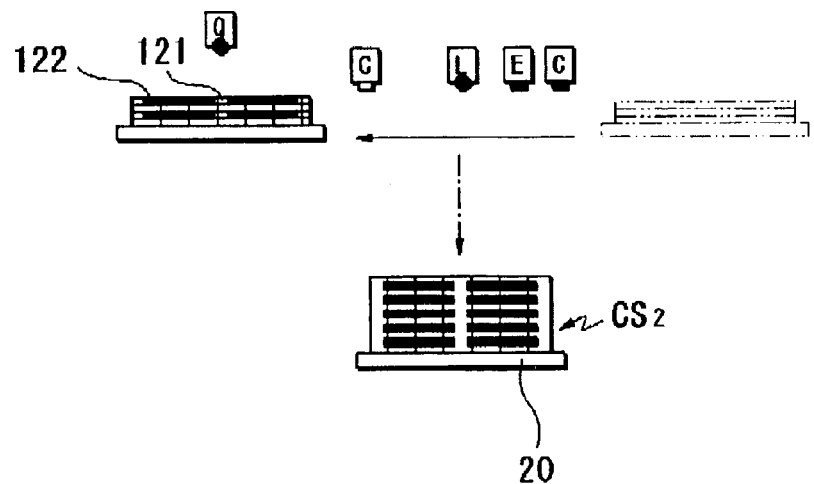
Figure 8A:
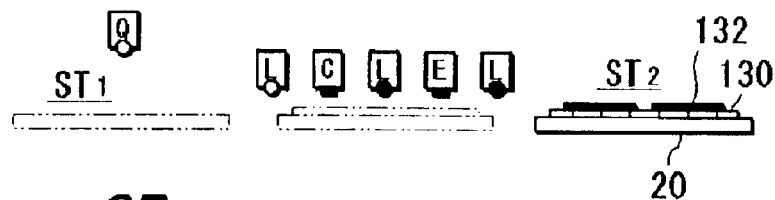
FIGS. 8A–8D are front views of assistance in explaining the working steps of a third embodiment of the present invention.
Figure 8B:
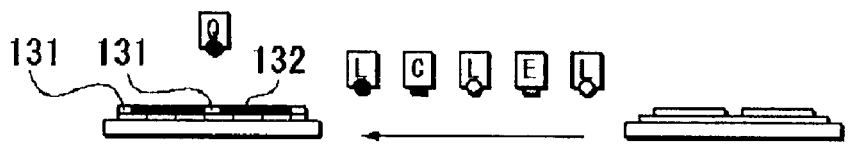
Figure 8C:
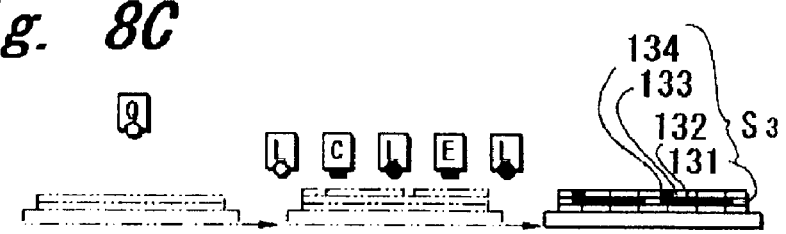
Figure 8D:
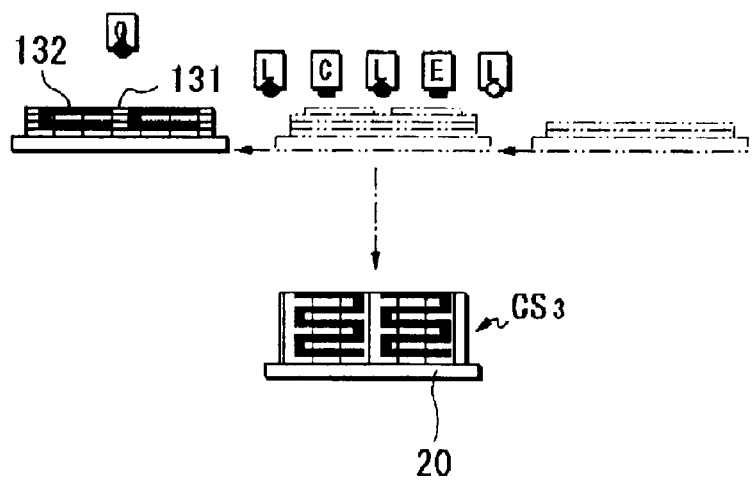
Figure 9A:
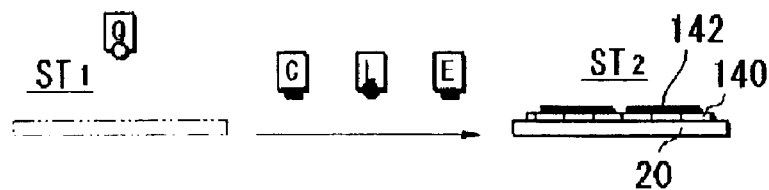
FIGS. 9A–9D are front views of assistance in explaining the working steps of a fourth embodiment of the present invention.
Figure 9B:
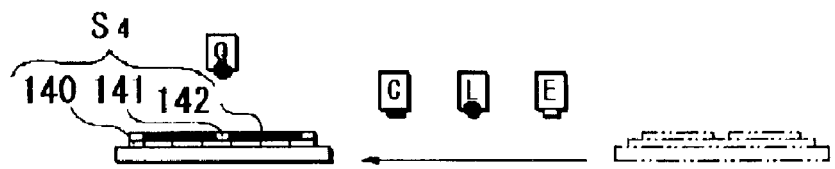
Figure 9C:
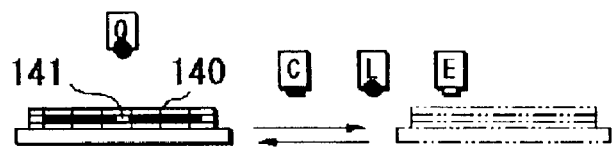
Figure 9D:
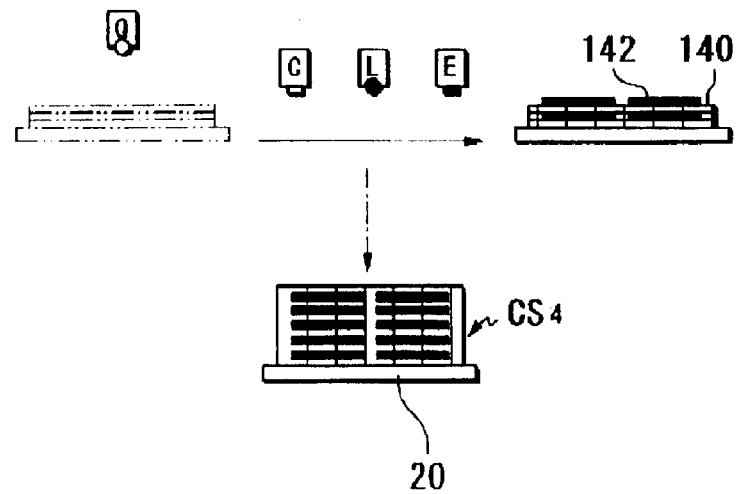
Figure 10A:
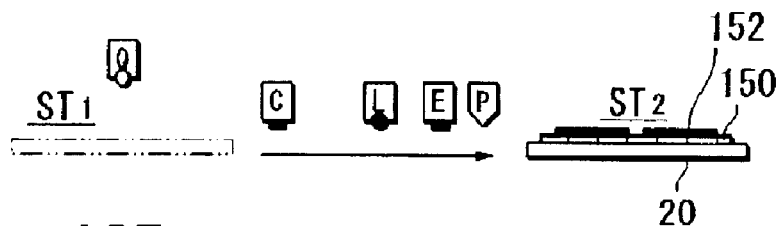
FIGS. 10A–10E are front views of assistance in explaining the working steps of a fifth embodiment of the present invention.
Figure 10B:
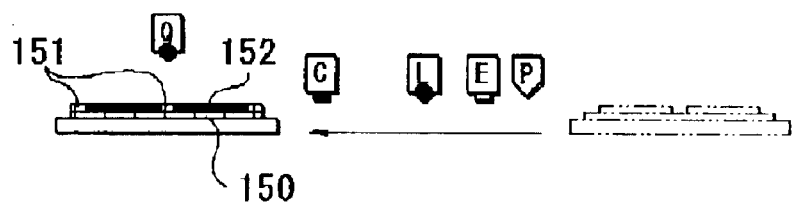
Figure 10C:
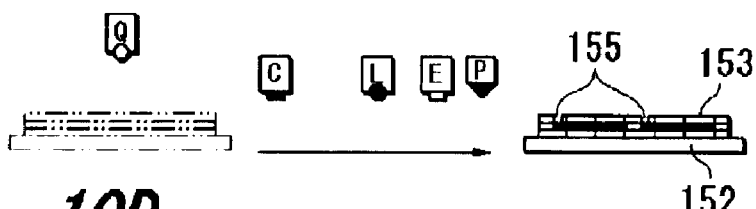
Figure 10D:
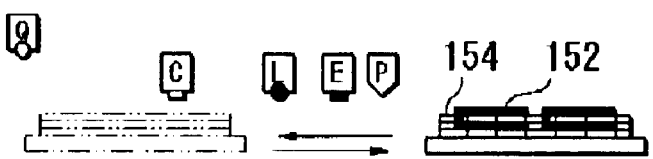
Figure 10E:
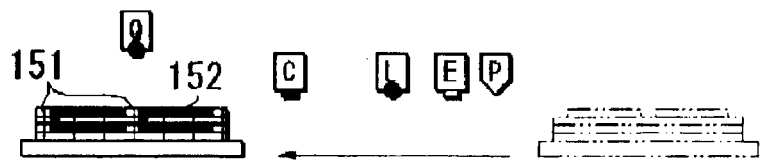
Figure 11A:
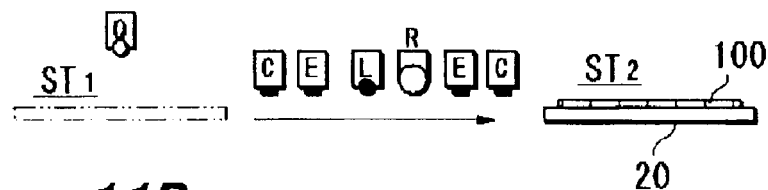
FIGS. 11A–11E are front views of assistance in explaining the working steps of a sixth embodiment of the present invention.
Figure 11B:
Figure 11C:
Figure 11D:
Figure 11E:
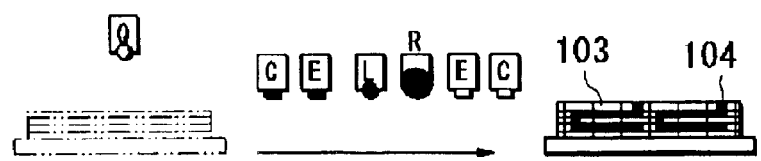

FIG. 5 shows another embodiment of the support member 31.

In FIG. 5, in each of support members 51, a rail part 52 is formed at both sides in the lower end part of a rectangular plate having a suitable thickness and is provided in the central part of the front surface with a nut hole 53.

The plurality of support members 51 are fixedly juxtaposed at predetermined spaces along the X axis direction in the support wall 3a of the housing back wall part 3 and are protruded horizontally above the working table 10.

In an attaching part 55 of each of the units C, E, L, P, R and Q, a fitted part 56 slidably fitted in the rail part 52 of the support member 51 is formed over the longitudinal direction, a contacting plate 57 brought into contact with the front surface of the support member 51 is integrally erected at its front end, and a fastening bolt 58 is rotatably attached to the contacting plate 57.

In the units C, E, L, P, R and Q, the fitted part 56 of each of the attaching parts 55 is slidably fitted in the rail part 52 of the support member 51. The contacting plate 57 is pressed against the front surface of the support member 51 to attach the fastening bolt 58 in a spiral to the nut hole 53. The support member 51 is fixed onto the support wall 3a via the attaching part 55 to be set in a predetermined position.

FIG. 1 shows a first embodiment of the present invention in which the light irradiation unit L is disposed in the substantially central part of the section between the stages $ST_1$ and $ST_2$, the conductor paste jet unit E and the insulating resin paste jet unit C are arranged at its both sides, respectively, and the CCD camera unit Q is arranged above the stage $ST_1$.

The numeral 60 shown in FIG. 1 denotes a paste layer supplying an insulating resin paste to the insulating resin paste jet unit C. The numeral 61 denotes a paste layer supplying a conductor paste to the conductor paste jet unit E.

In the first embodiment, an inductor and a stacked substrate as the stacked type electronic part are manufactured. Its working steps will be described in FIGS. 6A–6E.

In FIGS. 6A–6E, the base plate 20 is moved forth from the stage $ST_1$ to the stage $ST_2$ and moved back in the reverse direction. The light irradiation unit L, the conductor paste jet unit E, the insulating resin paste jet unit C and the CCD camera unit Q omit the respective attaching parts 45. The members whose lower end parts are blacked out are in an operation state or in a state operated when the base plate 20 reaches.

This point is the same in a second embodiment or after.

The following working steps are performed in the first embodiment.

Figure 12:
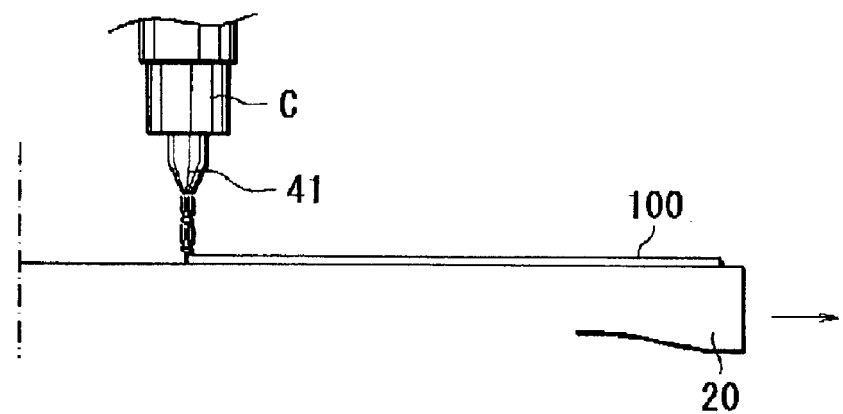
FIG. 12 is an enlarged view showing a step of forming an insulator layer by an insulating resin paste jet unit (insulator layer forming means)
Figure 17:
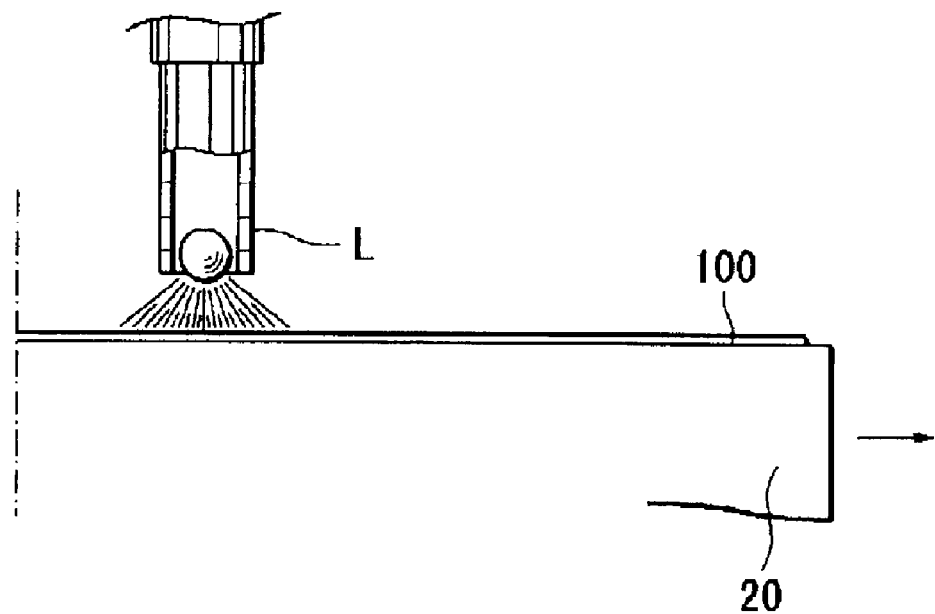
FIG. 17 is an enlarged view showing a drying step by a light irradiation unit (drying means)

(A) When the base plate 20 is moved forth first, the left side insulating resin paste jet unit C and the light irradiation unit L are operated. The insulating resin paste jet unit C jets the insulating resin paste to form a base insulator layer 100 having a predetermined area on the base plate 20 (see FIG. 12). The light irradiation unit L dries the insulator layer 100 so as to bring it into a half-hardened state so as not to be tacky (see FIG. 17).

(B) When the base plate 20 is moved back, the right side insulating resin paste jet unit C, conductor paste jet unit E, and the light irradiation unit L are operated.

Figure 13:
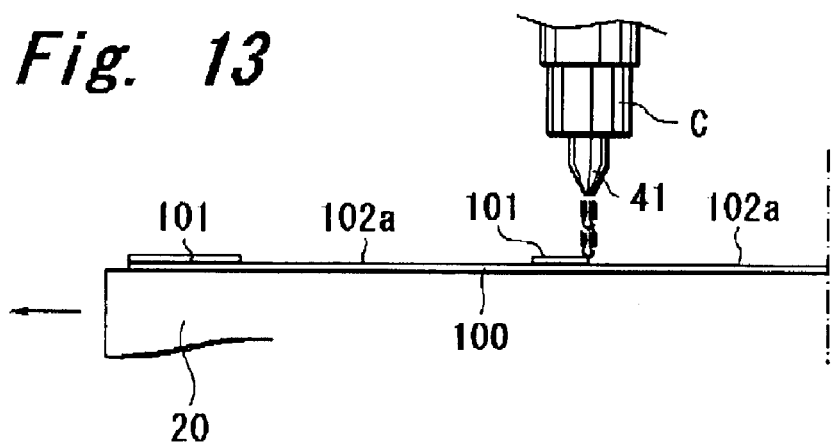
FIG. 13 is an enlarged view showing a step of forming a spacer insulator layer by the insulating resin paste jet unit.
Figure 14:
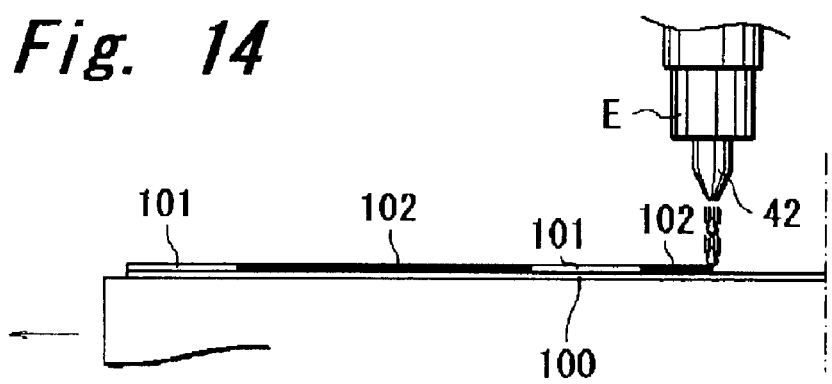
FIG. 14 is an enlarged view showing a step of forming an electrode layer by a conductor paste jet unit (electrode layer forming means)

The insulating resin paste jet unit C jets the insulating resin paste onto a region on the base insulator layer 100 except for a conductor pattern part (hereinafter, called an electrode pattern part) 102a to form a spacer insulator layer 101 (see FIG. 13). The base plate 20 passes below the conductor paste jet unit E. The unit E jets the conductor paste to form a conductor layer (hereinafter, called an electrode layer) 102 in the electrode pattern part 102a (see FIG. 14).

When the base plate 20 passes below the light irradiation unit L, the spacer insulator layer 101 and the electrode layer 102 formed in a predetermined pattern are dried.

When the base plate 20 is moved back to the stage $ST_1$, the camera unit Q is operated to image the surfaces of the formed insulator layer 101 and electrode layer 102 formed.

(C) When the base plate 20 is moved forth again, the left side insulating resin paste jet unit C, conductor paste jet unit E and the light irradiation unit L are operated.

Figure 15:
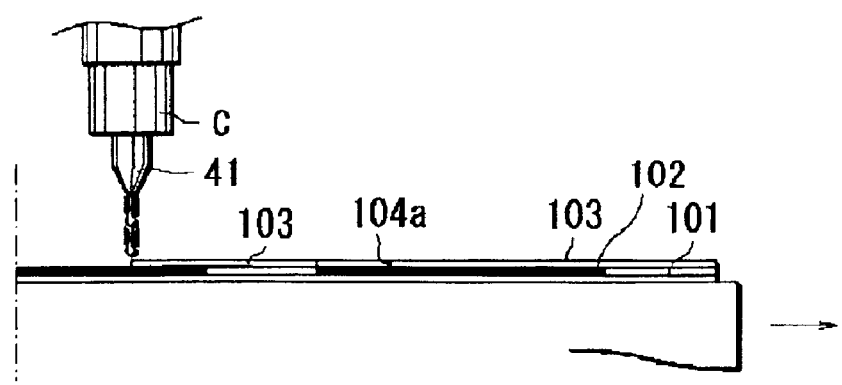
FIG. 15 is an enlarged view showing a step of forming an insulator layer by the insulating resin paste jet unit.
Figure 16:
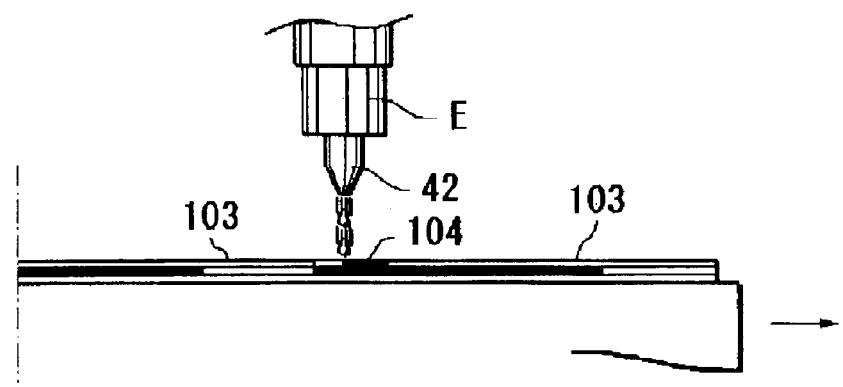
FIG. 16 is an enlarged view showing a step of forming a via electrode by the conductor paste jet unit.

The insulating resin paste jet unit C jets the insulating resin paste onto a region on the spacer insulator layer 101 and the conductor layer 102 except for a via conductor part (hereinafter, called a via electrode part) 104a to form an insulator layer 103 (see FIG. 15). The base plate 20 passes below the conductor paste jet unit E. The unit E jets the conductor paste to form a via conductor (hereinafter, called a via electrode) 104 in the via electrode part 104a (see FIG. 16).

In the step (A), a thin film layer of the base insulator layer 100 is formed. On its top surface is formed a thin film layer $S_1$ having the electrode layer 102 having the via electrode 104 and the insulator layers 101, 103 in the steps (B), (C) in which the base plate 20 is moved back and forth once.

Steps (D), (E) repeating the steps (B), (C) are worked continuously to manufacture an inductor $CS_1$ with many thin film layers stacked.

The surface images imaged in the step (B) or (D) are transmitted to the image processor, not shown. The presence or absence of a pin hole of the insulator layers 101, 103 and the presence or absence of wire breaking of the electrode layers 102, 104 are detected. When it is detected, the step operation is stopped to eliminate the thin film layer during manufacturing from the top of the base plate 20. The insulating resin paste jet unit C or the conductor paste jet unit E is inspected to replace the failed, clogged ink jet nozzle.

The thin film layer $S_1$ of the inductor $CS_1$ has a thickness of about 20 to 200 $\mu$m and its stacked number is about ten. The manufactured, stacked type electronic part is moved to another place for pressing, and then, is hardened by drying at low temperature to be cut for obtaining the inductors. In the case of the stacked substrate, it is cut into a predetermined area after hardening by drying at low temperature or is used as-is.

For drawing, the fewer electrode patterns are shown on the thin film layer $S_1$. Actually, many patterns are formed on the thin film layer $S_1$ to provide many inductors or stacked substrates. This point is the same in the second embodiment or after.

FIGS. 7A–7D show a second embodiment of the present invention in which a capacitor is manufactured as the stacked type electronic part. The light irradiation unit L is disposed in the substantially central part between the stages $ST_1$ and $ST_2$. Only the insulating resin paste jet unit C is arranged at the stage $ST_1$ side. The conductor paste jet unit E and the insulating resin paste jet unit C are arranged at the other side. The camera unit Q is arranged above the stage $ST_1$.

For the capacitor, the via electrode is unnecessary. The conductor paste jet unit E at the single side can be omitted.

The following working steps are performed in the second embodiment.

(A) The base plate 20 is moved forth first, the left side insulating resin paste jet unit C and the light irradiation unit L are operated. The insulating resin paste jet unit C jets the insulating resin paste to form an insulator layer 120 having a predetermined area on the base plate 20 The light irradiation unit L dries the insulator layer 120.

(B) When the base plate 20 is moved back, the right side insulating resin paste jet unit C, conductor paste jet unit E and the light irradiation unit L are operated.

The insulating resin paste jet unit C jets the insulating resin paste onto a predetermined region on the insulator layer 120 to form a spacer insulator layer 121. The base plate 20 passes below the conductor paste jet unit E. The unit E jets the conductor paste to form a conductor layer (electrode layer) 122 in a region in which the spacer insulator layer 121 is not coated.

When the base plate 20 passes below the light irradiation unit L, the spacer insulator layer 121 and the conductor layer (electrode layer) 122 formed in a predetermined pattern are dried.

When the base plate 20 is moved back to the stage $ST_1$, the camera unit Q is operated to image the surfaces of the formed insulator layer 121 and conductor layer (electrode layer) 122. As described previously, the surface images for inspecting the ink jet nozzle are transmitted to the image processor.

A thin film layer $S_2$ having the conductor layer (electrode layer) 122 and the insulator layers 121, 123 is formed in the steps (A), (B) in which the base plate 20 is moved back and forth once.

Steps (C), (D) repeating the steps (A), (B) are worked continuously to manufacture a stacked type electronic part with many thin film layers stacked.

The thin film layer $S_2$ of a capacitor $CS_2$ has a thickness of about 1 to 2 $\mu$m smaller than that of the prior art thin film layer and its stacked number is about several hundred. The manufactured, stacked type electronic part is moved to another place for pressing, and then, is hardened by drying at low temperature to be cut for obtaining the capacitors. Each of the capacitors $CS_2$ is provided with an external electrode.

FIGS. 8A–8D show a third embodiment of the present invention in which an inductor is manufactured. The light irradiation units L are disposed in the substantially central part between the stages $ST_1$ and $ST_2$ and spaced at its right and left sides. The insulating resin paste jet unit C is arranged between the light irradiation units L, L at its one side (the stage $ST_1$ side). The conductor paste jet unit E is arranged between the light irradiation units L, L at the other side. The camera unit Q is arranged above the stage $ST_1$.

The following working steps are performed in the third embodiment.

(A) When the base plate 20 is moved forth first, the insulating resin paste jet unit C, the conductor paste jet unit E and the central and right side light irradiation units L are operated.

The insulating resin paste jet unit C jets the insulating resin paste to form a base insulator layer 130 having a predetermined area on the base plate 20. The base insulator layer 130 is dried when passing below the central light irradiation unit L. When the base insulator layer 130 passes below the conductor paste jet unit E, the conductor paste jet unit E jets the conductor paste to form a conductor layer (hereinafter, called an electrode layer) 132 having a predetermined conductor pattern.

The electrode layer 132 is dried when passing below the right side light irradiation unit L.

(B) When the base plate 20 is moved back, the insulating resin paste jet unit C and the left side light irradiation unit L are operated.

The insulating resin paste jet unit C jets the insulating resin paste so as to fill the part between the electrode layers 132 (recessed part) on the base insulator layer 130 to form a spacer insulator layer 131. The spacer insulator layer 131 is dried when passing below the left side light irradiation unit L.

When the base plate 20 is moved back to the stage $ST_1$, the camera unit Q is operated to image the surfaces of the formed insulator layer 131 and electrode layer 132. As described previously, the surface images for inspecting the ink jet nozzle are transmitted to the image processor.

(C) When the base plate 20 is moved forth again, the insulating resin paste jet unit C, the conductor paste jet unit E and the central and right side light irradiation unit L are operated.

The insulating resin paste jet unit C jets the insulating resin paste onto a predetermined region on the spacer insulator layer 131 and the electrode layer 132 to form an insulator layer 133. The light irradiation unit L dries the insulator layer 133. The base sheet 20 passes below the conductor paste jet unit E. The unit E jets the conductor paste onto a region in which the insulator layer 133 is not coated to form a via conductor (via electrode) 134. The via electrode 134 is dried by the right side light irradiation unit L.

(D) When the base plate 20 is moved back again, the conductor paste jet unit E, the insulating resin paste jet unit C and the central and left side light irradiation unit L are operated.

The conductor paste jet unit E jets the conductor paste onto the insulator layer 133 and the via electrode 134 to form the electrode layer 132 having a predetermined electrode pattern. The light irradiation unit L dries the electrode layer 132. The base plate 20 passes below the insulating resin paste jet unit C. The unit C jets the insulating resin paste onto a region in which the electrode layer 132 is not coated to form the spacer insulator layer 131. The spacer insulator layer 131 is dried by the left side irradiation unit L.

When the base plate 20 is moved back to the stage $ST_1$, the camera unit Q is operated to image the surfaces of the formed insulator layer 131 and electrode layer 132.

After the steps (A) to (D), the steps (C), (D) in which the base plate 20 is moved back and forth once are repeated to obtain an inductor $CS_3$ stacked with a thin film layer S3 having the electrode layer 132 having the via electrode 134 and the insulator layers 131, 133.

According to the third embodiment, each time the insulator layer or the electrode layer is formed, the light irradiation unit L dries the layer surfaces. Coating and printing accuracies of the spacer insulator layer 131, the electrode layer 132, the insulator layer 133 and the via electrode 134 are improved.

FIGS. 9A–9D show a fourth embodiment of the present invention in which a capacitor is manufactured as the stacked type electronic part. The light irradiation unit L is disposed in the substantially central part between the stages $ST_1$ and $ST_2$. The insulating resin paste jet unit C is arranged at its left side. The conductor paste jet unit E is arranged at its right side. The camera unit Q is arranged above the stage $ST_1$.

The following working steps are performed in the fourth embodiment.

(A) When the base plate 20 is moved forth first, all of the insulating resin paste jet unit C, the light irradiation unit L and the conductor paste jet unit E are operated. The insulating resin paste jet unit C jets the insulating resin paste to form an insulator layer 140 having a predetermined area on the base sheet 20. The insulator layer 140 is dried when passing below the light irradiation unit L.

When the insulator layer 140 passes below the conductor paste jet unit E, the conductor paste jet unit E jets the conductor paste to form an electrode layer 142 having a predetermined electrode pattern.

(B) When the baser plate 20 is moved back, the light irradiation unit L and the insulating resin paste jet unit C are operated.

The electrode layer 142 formed in the step (A) is dried when passing below the light irradiation unit L. The insulating resin paste jet unit C jets the insulating resin paste so as to fill the part between the electrode layers 142 (recessed part) on the insulator layer 140 to form a spacer insulator layer 141.

When the base plate 20 is moved back to the stage $ST_1$, the camera unit Q is operated to image the surfaces of the formed insulator layer 141 and electrode layer 142.

(C) The base plate 20 is moved back and forth in the short section to the position in which it does not reach the stage $ST_2$, specifically, the section to the position in which the base plate 20 passes below the light irradiation unit L from the stage $ST_1$. During that, the light irradiation unit L and the insulating resin pate jet unit C are operated.

At moving forth in the short section, the spacer insulator layer 141 formed in the step (B) is dried when passing below the light irradiation unit L. At moving back therein, when the base plate 20 passes below the insulating resin paste jet unit C, the unit C jets the insulating resin paste to form the insulator layer 140 on the electrode layer 142.

When the base plate 20 is moved back to the stage $ST_1$, the camera unit Q is operated to image the surface of the formed insulator layer 140, as described previously.

(D) The base plate 20 is moved forth. At the moving forth, the light irradiation unit L and the conductor paste jet unit E are operated.

The insulator layer 140 formed in the step (C) is dried by the light irradiation unit L. The conductor paste jet unit E jets the conductor paste onto the insulator layer 140 to form the electrode layer 142 having a predetermined pattern.

After the steps (A) to (D), the steps (B) to (D) are repeated to obtain a capacitor $CS_4$ stacked with a thin film layer $S_4$ having the electrode layer 142 and the insulator layers 140, 141.

According to the fourth embodiment, the number of the insulating resin paste jet units C, the conductor paste jet units E and the light irradiation units L can be least. The moving distance of the base plate 20 can be shortened.

FIGS. 10A–10E show a fifth embodiment of the present invention in which an inductor and a stacked substrate are manufactured. Specifically, the laser unit P is used for manufacturing a via hole for forming a via electrode.

In other words, the laser unit P is disposed in addition to the insulating resin paste jet unit C, the light irradiation unit L, the conductor paste jet unit E and camera unit Q corresponding to the second embodiment.

The following working steps are performed in the fifth embodiment.

(A) When the base plate 20 is moved forth first, the insulating resin paste jet unit C, the light irradiation unit L and the conductor paste jet unit E are operated. The insulating resin paste jet unit C jets the insulating resin paste to form a base insulator layer 150 having a predetermined area on the base plate 20. The base insulator layer 150 is dried when passing below the light irradiation unit L.

When the base insulator layer 150 passes below the conductor paste jet unit E, the conductor paste jet unit E jets the conductor paste to form an electrode layer 152 having a predetermined electrode pattern.

(B) When the base plate 20 is moved back, the light irradiation unit L and the insulating resin paste jet unit C are operated.

The electrode layer 152 formed in the step (A) is dried when passing below the light irradiation unit L. The insulating resin paste jet unit C jets the insulating resin paste so as to fill the part between the electrode layers 152 (recessed part) on the base insulator layer 150 to form a spacer insulator layer 151.

When the base plate 20 is moved back to the stage $ST_1$, the camera unit Q is operated to image the surfaces of the formed insulator layer 151 and electrode layer 152.

(C) When the base plate 20 is moved forth again, the insulating resin paste jet unit C, the light irradiation unit L and the laser unit P are operated.

When the base plate 20 passes below the insulating resin paste jet unit C, the insulating resin paste is jetted to form an insulator layer 153 covering the entire top surface of the spacer insulator layer 151 and the electrode layer 152. It is dried when passing below the light irradiation unit L.

When the base plate 20 passes below the laser unit P, the unit P holes a via hole 155 to the electrode layer 152 at a predetermined position of the insulator layer 153.

(D) The base plate 20 starts moving back from the stage $ST_2$. The base plate 20 is moved back and forth in the section to the position in which it is not moved back to the stage $ST_1$, specifically, the section in which the base plate 20 passes below the light irradiation unit L from the stage $ST_2$. During that, the light irradiation unit L and the conductor paste jet unit E are operated.

At the moving back in the short section, when passing below the conductor paste jet unit E, the unit E jets the conductor paste and fills it into the via hole 155 to form a via electrode 154. The via electrode 154 is dried when passing below the light irradiation unit L. At the moving forth in the short section, the conductor paste jet unit E forms the electrode layer 152 in a predetermined pattern on the top surface of the insulator layer 153 and the via electrode 154.

(E) When the base plate 20 is moved back after that, the insulating resin paste jet unit C and the light irradiation unit L are operated.

The electrode layer 152 formed in the step (D) is dried when passing below the light irradiation unit L. The insulating resin paste jet unit C jets the insulating resin paste onto a region in which the electrode layer 152 is not coated to form the spacer insulator layer 151.

When the base plate 20 is moved back to the stage $ST_1$, the camera unit Q is operated to image the surface of the formed insulator layer 151 and electrode layer 152.

After the steps (A) to (E), the steps (C) to (E) are repeated to obtain an inductor equal to that of the second embodiment.

FIGS. 11A–11E show a sixth embodiment of the present invention in which the structure of an inductor and a stacked substrate is printed, specifically, the roll pressing unit R is provided as the temporary pressing unit. Specifically, the roll pressing unit R is added to the arrangement structure of the first embodiment.

The working steps of the first embodiment are described already based on FIGS. 6A–6E. For convenience of the description, the same numerals are indicated in the drawing to omit the description. A roll pressing unit R is disposed between the central light irradiation unit L and the right side conductor paste jet unit E to be moved vertically. The roll pressing unit R is operated (moved downward) in the step (C).

In the operation of the step (C) the insulator layer 103 formed with the via electrode 104 is dried when passing below the light irradiation unit L. The roll pressing unit R is moved downward on the base plate 20 which is moved forth and presses the top surfaces of the via electrode 104 and the insulator layer 103 to temporarily press the thin film layer.

The temporary pressing flattens micro-irregularities caused in the top surface of the thin film layer to enhance contact properties with the lower thin film layer.

Figure 18:
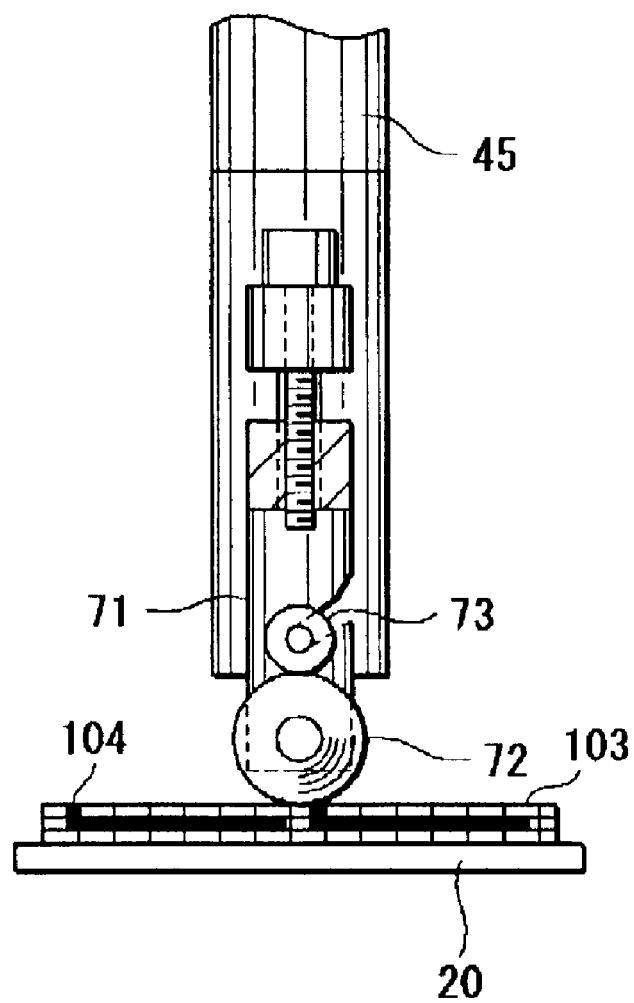
FIG. 18 is an enlarged view showing a specific example of a roll pressing unit (temporary pressing means)

A specific structure of the roll pressing unit R is shown in FIG. 18.

In FIG. 18, in the roll pressing unit R, the surface of a pressing roll 72 rotatably arranged in a support member 71 is subjected to a surface treatment having very small adhesiveness. A particle removing roller 73 having adhesiveness is rotatably brought into contact with on the surface to provide the support member 71 to be moved vertically while both are contacted.

The roll pressing unit R presses the top surfaces of the via electrode 104 and the insulator layer 103 in its operation, as described above, to temporarily press the thin film layer. When a particle comes off from the via electrode 104 and the insulator layer 103, the particle is adhered onto the surface to be removed from the thin film layer. The particle adhered onto the pressing roll 72 is transferred onto the surface of the particle removing roller 73 having adhesiveness higher than that of the roll 72.

The particle transferred onto the particle removing roller 73 is cleaned by removing the particle removing roller 73 at the appropriate time. Otherwise, it is removed by bringing a separating member, not shown, into contact with the particle removing roller 73.

In the above embodiments, the base plate 20 is moved downward with downward movement of the moving table 14 each time the base plate 20 is moved forth or back. The downward movement distance is a thickness of the insulator layer and the conductor layer formed when the base plate 20 is moved forth or back. The units and the top surface of the formed layer are held constant.

The base plate 20 can be moved a short distance by movement of the moving table 14 in the Y axis direction. After setting the units onto the support member, it is used for adjustment for positioning the base plate there below according to the depth length (length in the Y axis direction) of the units.

Figure 19:
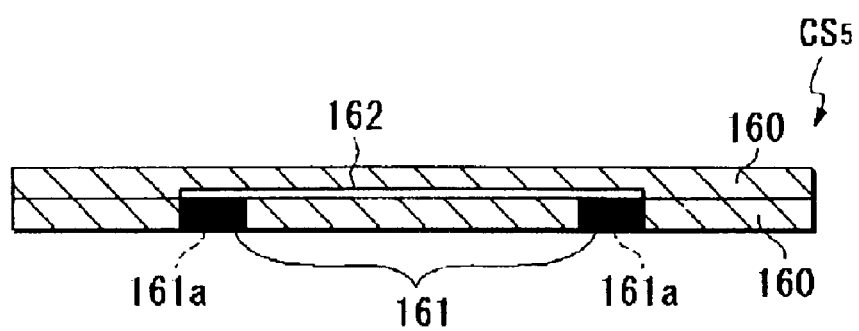
FIG. 19 shows the case of a single layer in the enlarged cross-sectional view of a seventh embodiment.
Figure 20:
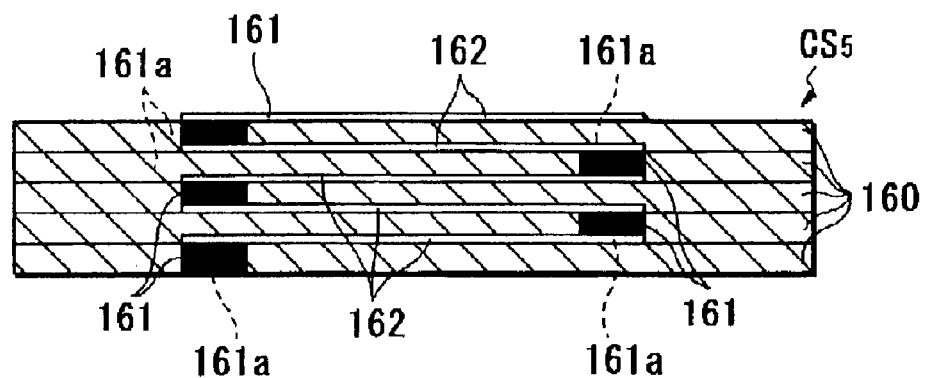
FIG. 20 shows the case of a plurality of layers in the enlarged cross-sectional view of the seventh embodiment.

FIGS. 19 and 20 are a seventh embodiment and show cross-sectional views of a resistor (the seventh embodiment) $CS_5$ as the manufactured stacked type electronic part. The resistor $CS_5$ has an insulator layer 160, a via electrode 161 filled into a via hole 161a, and a resistance part 162 communicated onto the via electrode 161. Although not shown, above the base plate are juxtaposed insulating resin paste jet means (insulating resin paste jet unit) jetting an insulating resin paste, conductor paste jet means (conductor paste jet means (conductor paste jet unit), drying means (light irradiation unit), laser holing means (holing unit), and conductor paste jet means (conductor paste jet means) for the resistance part. The respective means are suitably operated while the base plate is moved back and forth several times in the predetermined linear section path to form the via electrode 161 in the insulator layer 160. A thin film layer having a predetermined wiring pattern communicating the resistance part 162 to the via electrode 161 is formed. They are repeated to form the resistor $CS_5$. A specific manufacturing procedure is omitted.

FIG. 19 shows the case that the resistor $CS_5$ is made of a single thin film layer. FIG. 20 shows that it is made of a plurality of thin film layers.

Figure 21:
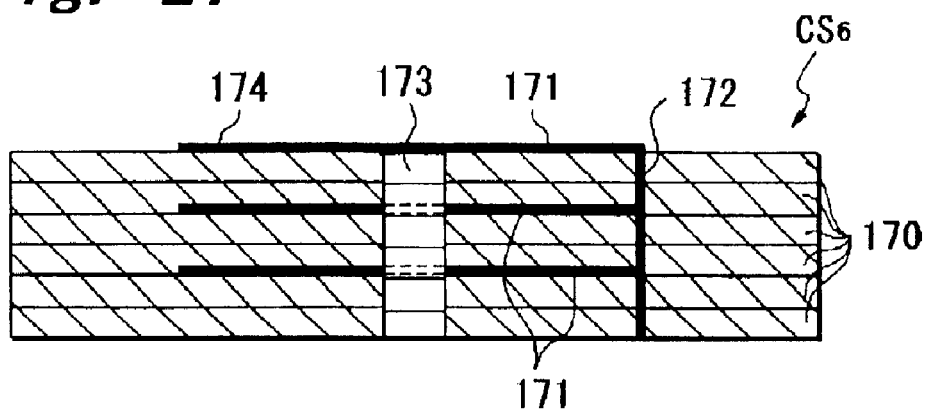
FIG. 21 is an enlarged cross-sectional view of a magnetic material of an eighth embodiment.
Figure 22:
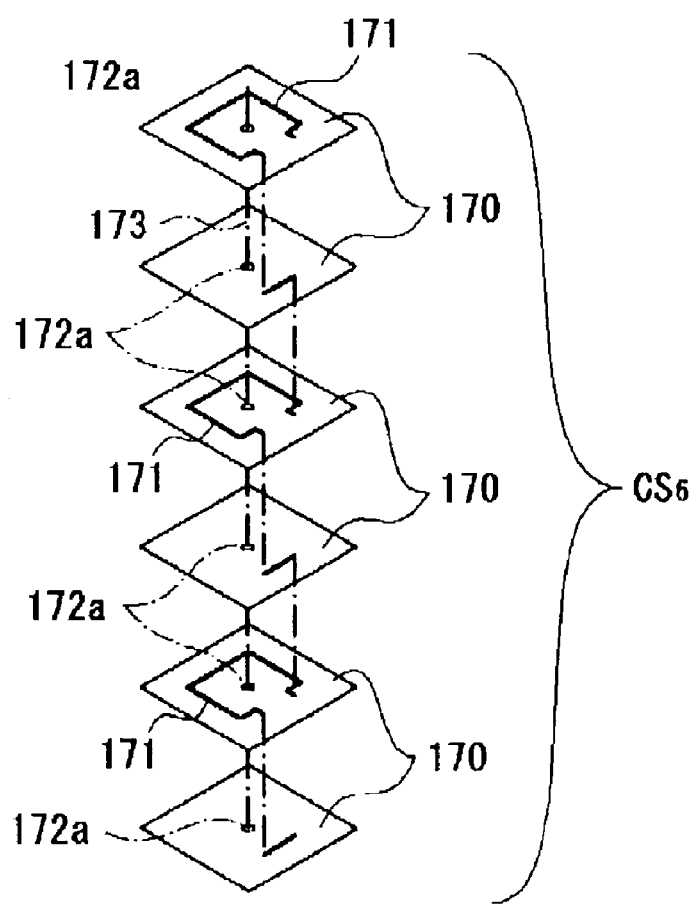
FIG. 22 is an exploded perspective view of the magnetic material.

FIGS. 21 and 22 are a cross-sectional view of a magnetic material (an eighth embodiment) $CS_6$ as the manufactured, stacked type electronic part and its exploded perspective view. The numeral 170 denotes an insulator layer; the numeral 171, an electrode layer; the numeral 172, a via conductor filled into a via hole 172*a*; and the numeral 173, a magnetic material body formed by a via conductor stacked. Although not shown, as in the resistor, above the base plate 20 are juxtaposed insulating resin paste jet means (insulating resin paste jet unit) jetting an insulating resin paste, conductor paste jet means (conductor paste jet unit), drying means (light irradiation unit), laser holing means, and conductor paste jet means for the magnetic material body. The respective means are suitably operated while the base plate is moved back and forth several times in the predetermined linear section path to form an inductor (circuit) 174 in a plurality of thin film layers. The magnetic material body 173 is formed in its central part. As in the seventh embodiment, a specific manufacturing procedure is omitted.

In the above embodiments, the specific structure, arrangement, and working steps of the units such as the insulator layer forming unit and the conductor layer forming unit are described. The present invention can suitably modify their arrangement, number, and working steps along its purpose and is not limited to the embodiment description.

For example, the insulator layer forming unit may be the doctor blade system. The support member attaching the units is not limited to the structure of FIGS. 3 or 5. The CCD camera unit is arranged above the stage $ST_2$ to image a surface image each time the base plate 20 is moved forth or back.

Although not the embodiment of the present invention, an apparatus for manufacturing a stacked type electronic part may have a stage, insulating resin sheet supply means superimposing insulating resin sheets, conductor layer forming means jetting a conductor paste, insulator layer forming means discharging an insulating resin paste, and drying means drying the pastes, wherein while the insulating resin sheet supply means supplies insulating resin sheets, the respective means stack on the stage a required number of thin film layers having a predetermined conductor pattern placed on an insulator layer.

As its specific structure, the insulating resin sheet supply means superimposing insulating resin sheets is added to the stage moving back-and-forth type specified in claim 4, the drum type or the means getting in-and-out type (not shown). Each time the insulating resin sheet is supplied on the stage, the conductor pattern is formed by discharging from the conductor layer forming means between the insulating resin sheets. The part between the conductor patterns (recessed part) are filled by the insulating resin paste discharged from the insulator layer forming means to form a required number of thin film layers with a predetermined conductor pattern placed. As the conductor layer forming means and the insulator layer forming means, the doctor blade system, the ink jet system or the roller coating system, which is generally known, is employed. To increase the accuracy corresponding to the denser insulator layer, the ink jet system is preferably employed.

When using the insulating resin sheets, the thin film layer with a predetermined conductor pattern placed is formed between the plurality of insulating resin sheets. The thin film layer is sandwiched between the insulating resin sheets to enhance flatness thereof. The insulating resin sheet is superimposed onto the thin film layer. The working time can be shorter as compared with the case that a flat insulator layer (an insulator layer of the upper and lower sides of the thin film layer having an electrode layer) is formed by jetting ceramics slurry.

A thin film layer having a conductor pattern can be formed with good flatness and high accuracy. The insulator layers of the upper and lower sides of the thin film layer can be formed by the insulating resin sheet in a short time. A high quality stacked type electronic part having a high inner accuracy can be produced efficiently.

When mounting an IC and a memory, the positioning concave part of the IC or memory is provided in the thin film layer stacking step by controlling the discharging position and the jetting position of the insulating resin paste and the conductor paste. A terminal part is provided in the bottom of the concave part with the conductor paste in communication with a via conductor. The IC and memory may be positioned in the positioning concave part so as to be connected to the terminal part. It is coated by the thin film layer stacked with the IC and memory when necessary.

A connector is connected via an adhesive so as to be conductive to the via conductor after firing the thin film layer.

The present invention is an apparatus for manufacturing a stacked type electronic part which stacks a required number of thin film layers having a predetermined conductor pattern made of the conductor paste placed on the insulator layer made of the insulating resin paste. After stacking a required number of thin film layers, the thin film layers are integrated to be a product. To do this, firing at high temperature using a large furnace like ceramics slurry is unnecessary. A product is manufactured by drying at low temperature, and the productivity can be enhanced.

The least required number of the insulator layer forming means, the conductor layer forming means and the drying means may be juxtaposed. The necessary length of the section path can be set to be short. It is possible to provide a manufacturing apparatus which can be practically used, small and inexpensive by the least number of the forming means.

At least one of the drying means is arranged in the substantially central part of the section path to efficiently continue the working steps such as the insulator layer forming step and the conductor layer forming step. The moving section path of the base plate is shortest to make the apparatus smaller.

The ink jet system is employed as at least one of the insulator layer forming means. The insulating resin paste is filled into the recessed part between the conductor layers. The insulator layer can be formed at high accuracy. The flatness of the thin film layer can be secured to remove the cause of a void. The high quality of the stacked type electronic part manufactured can be secured.

The conductor layer forming means jets the conductor paste by the ink jet system. The conductor layer forming means directly irradiates the conductor paste onto the conductor pattern (for example, conductor pattern) to form the via conductor (via electrode) at high accuracy, reliably and quickly without holing a via hole.

When the via hole is holed by the laser holing system, the conductor layer forming means can fill the conductor paste to form the via conductor (for example, via electrode) reliably at high accuracy.

The top surface of the formed thin film layer is temporarily pressed. The irregularities of the top surface of the insulator layer and the conductor pattern formed by the insulator layer forming means and the conductor layer forming means are flattened to be flush to increase the stacked layer accuracy of the next thin film layer for enhancing the contact properties of the lower thin film layer, thereby integrating the layers uniformly. A high quality stacked type electronic part can be manufactured.

In addition to the temporary pressing means, the particle of the insulating resin paste and the conductor paste is removed so as not to be included mutually. A higher quality stacked type electronic part can be manufactured.

The insulating layer forming unit, the conductor layer forming unit, the drying unit and the laser holing means are units. The units can be easily set. The units can be exchanged with each other. The arrangement of the units is changed to set them to an apparatus for manufacturing a different stacked type electronic part such as a capacitor and an inductor. A general-purpose small apparatus can be provided at lower cost.

Having described specific preferred embodiments of the invention with reference to the accompanying drawings, it will be appreciated that the present invention is not limited to those precise embodiments, and that various changes and modifications can be effected therein by one of ordinary skill in the art without departing from the scope of the invention as defined by the appended claims.

What is claimed is:

1. An apparatus for manufacturing a stacked type electronic part having a stage, an insulator layer former that discharges an insulating resin paste, and a conductor layer former that jets a conductor paste, wherein said insulator layer former and said conductor layer former stack on said stage a required number of thin film layers having a predetermined conductor pattern placed on an insulator layer, wherein said stage is a base plate, the base plate being provided in a predetermined linear section path so as to be moved back and forth and be moved vertically, above the section path are juxtaposed one or more insulator layer formers that discharge an insulating resin paste, conductor layer formers that jet a conductor paste and dryers that dry said pastes, and a required number of thin film layers having a predetermined conductor pattern placed on an insulator layer are stacked while said base plate is moved back and forth in said section path one or more times.

2. The apparatus for manufacturing a stacked type electronic part according to claim 1, wherein at least one of said dryers is arranged in the substantially central part of said section path.

3. The apparatus for manufacturing a stacked type electronic part according to claim 2, wherein at least one of said insulator layer formers jets the insulating resin paste by the ink jet system to form an insulator layer.

4. The apparatus for manufacturing a stacked type electronic part according to claim 2, wherein said insulator layer former fills the insulating resin paste into a recessed part between conductor layers formed by the conductor layer former or a predetermined region except for a region formed with the conductor layer.

5. The apparatus for manufacturing a stacked type electronic part according to claim 2, wherein said conductor layer former jets the conductor paste onto said conductor pattern by the ink jet system to form a via conductor.

6. The apparatus for manufacturing a stacked type electronic part according to claim 1, wherein at least one of said insulator layer formers jets the insulating resin paste by the ink jet system to form an insulator layer.

7. The apparatus for manufacturing a stacked type electronic part according to claim 6, wherein said insulator layer former fills the insulating resin paste into a recessed part between conductor layers formed by the conductor layer former or a predetermined region except for a region formed with the conductor layer.

8. The apparatus for manufacturing a stacked type electronic part according to claim 6, wherein said conductor layer former jets the conductor paste onto said conductor pattern by the ink jet system to form a via conductor.

9. The apparatus for manufacturing a stacked type electronic part according to claim 1, wherein said insulator layer former fills the insulating resin paste into a recessed part between conductor layers formed by the conductor layer former or a predetermined region except for a region formed with the conductor layer.

10. The apparatus for manufacturing a stacked type electronic part according to claim 9, wherein said conductor layer former jets the conductor paste onto said conductor pattern by the ink jet system to form a via conductor.

11. The apparatus for manufacturing a stacked type electronic part according to claim 1, wherein said conductor layer former jets the conductor paste onto said conductor pattern by the ink jet system to form a via conductor.

12. The apparatus for manufacturing a stacked type electronic part according to claim 1, wherein a laser device that provides a via hole in said insulator layer is provided, and said conductor layer former fills the conductor paste into the via hole provided by the laser device to form a via conductor.

13. The apparatus for manufacturing a stacked type electronic part according to claim 1, wherein a temporary presser that presses the top surface of said thin film layer at the appropriate time when stacking the layer is provided.

14. The apparatus for manufacturing a stacked type electronic part according to claim 13, wherein said temporary presser is a pressing roll contacted with the insulating resin paste and the conductor paste dried by the dryer and having on its surface very small adhesiveness, and a particle removing roller having adhesiveness is brought into contact with the roller.

15. The apparatus for manufacturing a stacked type electronic part according to claim 14, wherein in addition to said insulator layer former, conductor layer former and dryer, a laser device that provides a via hole in an insulator layer is provided, the laser device is a unit, and the units can be exchanged with each other.

16. The apparatus for manufacturing a stacked type electronic part according to claim 1, wherein said insulator layer is an ink jet system.

17. The apparatus for manufacturing a stacked type electronic part according to claim 16, wherein at least one of said insulator layer formers jets the insulating resin paste by the ink jet system to form an insulator layer.

18. The apparatus for manufacturing a stacked type electronic part according to claim 16, wherein said insulator layer former fills the insulating resin paste into a recessed part between conductor layers formed by the conductor layer former or a predetermined region except for a region formed with the conductor layer.

19. The apparatus for manufacturing a stacked type electronic part according to claim 16, wherein said conductor layer former jets the conductor paste onto said conductor pattern by the ink jet system to form a via conductor.

20. The apparatus for manufacturing a stacked type electronic part according to claim 1, wherein said insulator layer former, conductor layer former and dryer are units, respectively, and the units can be exchanged with each other.

21. The apparatus for manufacturing a stacked type electronic part according to claim 1, wherein said insulator layer former fills the insulating resin paste into a recessed part between conductor layers formed by the conductor layer former or a predetermined region except for a region formed with the conductor layer.

22. An apparatus for manufacturing a stacked type electronic part having a stage, an insulator layer former that discharges an insulating resin paste, a conductor layer former that jets a conductor paste, and a dryer that dries said pastes, wherein said insulator layer former and said conductor layer former stack on said stage a required number of thin film layers having a predetermined conductor pattern placed on an insulator layer, wherein said insulator layer former, conductor layer former and dryer are units, respectively, and the units can be exchanged with each other.

23. An apparatus for manufacturing a stacked type electronic part having a stage, an insulator layer former that discharges an insulating resin paste and a dry solvent, a conductor layer former that jets a conductor paste and said dry solvent, and a dryer that dries said pastes, wherein said insulator layer former and said conductor layer former stack on said stage a required number of thin film layers having a predetermined conductor pattern placed on an insulator layer, wherein said insulator layer former, conductor layer former and dryer are units, respectively, and the units can be exchanged with each other.

* * * * *

UNITED STATES PATENT AND TRADEMARK OFFICE
CERTIFICATE OF CORRECTION

PATENT NO. : 6,958,095 B2
DATED : October 25, 2005
INVENTOR(S) : M. Kakimoto et al.

It is certified that error appears in the above-identified patent and that said Letters Patent is hereby corrected as shown below:

<u>Title page,</u>
Insert Item: -- [73] Assignee:  UHT Corporation, Aichi-ken (JP) --.

Signed and Sealed this

Twenty-first Day of February, 2006

JON W. DUDAS
*Director of the United States Patent and Trademark Office*